United States Patent [19]
Kengeri et al.

[11] Patent Number: 5,717,645
[45] Date of Patent: Feb. 10, 1998

[54] RANDOM ACCESS MEMORY WITH FAST, COMPACT SENSING AND SELECTION ARCHITECTURE

[75] Inventors: Subramani Kengeri, San Jose; Chitranjan N. Reddy, Los Altos Hills, both of Calif.

[73] Assignee: Alliance Semiconductor Corporation, San Jose, Calif.

[21] Appl. No.: 797,810

[22] Filed: Feb. 7, 1997

[51] Int. Cl.$^6$ ................................. G11C 13/00
[52] U.S. Cl. ................ 365/230.01; 365/189.02; 365/203
[58] Field of Search .............. 365/189.01, 189.02, 365/189.04, 230.01, 203, 230.06

[56] References Cited

U.S. PATENT DOCUMENTS

| | | | |
|---|---|---|---|
| 3,959,783 | 5/1976 | Pressineau | 365/189.01 |
| 4,379,342 | 4/1983 | Nakano et al. | 365/182 |
| 5,384,726 | 1/1995 | Tomita et al. | 365/63 |
| 5,535,172 | 7/1996 | Reddy et al. | 365/230.03 |

OTHER PUBLICATIONS

Kertis et al., "A 60 ns 256KX1 Bit DRAM Using LD$^3$ Technology and Double-Level Metal Interconnection", *IEEE Journal of Solid-State Circuits*, vol. SC-19, No. 5, Oct. 1984, pp. 585-590.

Kayano et al., "25-ns 256KX1/64KX4 CMOS SRAM's", *IEEE Journal of Solid-State Circuits*, vol. SC-21, No. 5, Oct. 1986, pp. 686-691.

*Primary Examiner*—Terrell W. Fears
*Attorney, Agent, or Firm*—Bradley T. Sako

[57] ABSTRACT

A random access memory (RAM) (10) is disclosed. A network of driver lines (28) extends over a number of core arrays (12a-12p) connecting a control bank 24 with column decode banks (26a and 26b), and the column decode banks (26a and 26b) with sense banks 46 within the core arrays (12a-12p). The driver lines 28 include predecode lines 30 and clock lines 32 for coupling predecode signals and clock signals from the control bank 24 to the column decode banks (26a and 26b). In addition, the driver lines 28 include column select lines 34 and sense driver lines 36 for coupling column select signals and sense amplifier enable signals from the column decode banks (26a and 26b) to the sense banks 46. The sense banks 46 include sense amplifiers 80 that are shared between array quadrants 42 by decoded transfer gate banks (70a and 70b). Advantageous placement of precharge circuits 82 and equalization circuits 86 provides a compact sense bank structure 46.

31 Claims, 7 Drawing Sheets

RANDOM ACCESS MEMORY WITH FAST, COMPACT SENSING AND SELECTION ARCHITECTURE

TECHNICAL FIELD

The present invention relates generally to semiconductor memory devices and more particularly random access memory architectures.

BACKGROUND OF THE INVENTION

Random access memories (RAM) allow dam to be read from or written to a memory cell, or a number of memory cells, in response to a memory address. As system processing speeds increase, the speed at which data must be accessed from RAMs also increases. In a typical RAM read, external memory address signals are received by the RAM, address decoding circuitry situated on the RAM activates a word line, and the word line in turn couples a row of memory cells to a number of bit lines. This action generates a data signal on the bit lines, usually in the form of a differential voltage. The data signal is amplified by sensing circuits (sense amplifiers) and then passed on to input/output (I/O) lines according to a column decoding scheme. In a typical RAM write, a word line is activated in response to a row address, and couples a row of memory cells to bit lines. Externally applied data signals are received by the RAM, amplified, and then placed on the I/O lines. According to a column decoding scheme, the I/O lines are coupled to selected bit lines, writing data into selected cells of the row.

The speed of the RAM read and write operations described above, depends upon how fast decoding and sensing can occur after the device receives an external signal. For example, in asynchronous dynamic RAMs (DRAMs) a memory address must be received, decoded, and the resulting data must be amplified (sensed) in response to a timing signal (commonly the row address strobe (RAS) signal). For asynchronous static RAMs (SRAMs) the timing signal is commonly generated by a transition in the applied memory address. For synchronous DRAMs (SDRAMs) and synchronous SRAMs, the timing signal is an external system clock. Due to the very high read and write speeds required, the physical routing of timing and decoding signals can play an important role in the speed of a RAM. Conventional RAMs architectures typically route timing signals and decoding signals peripheral to the arrays.

While faster RAM speeds are more desirable from an application point of view, smaller, more compact RAM designs are desirable from a manufacturing and design point of view. In order to maximize the amount of devices that can be manufactured on a single semiconductor wafer, it is desirable to fit a RAM devices into as small a section of the wafer (die) as is possible. While process improvements can reduce basic device geometries, size constraints are often introduced by the architecture of the RAM itself. For example, sensing circuits and column decoding circuits are typically placed between adjacent arrays. Therefore a minimum amount of area must be dedicated to this location. While such circuits could be moved, the necessary signal routing, particularly if done peripheral to the array, can introduce too great a delay.

Another factor affecting RAM architectures is package configuration. For example, RAMs are commonly packaged in injection molded epoxy resin packages. The packages have a generally rectangular shape having longer lengths than widths. Accordingly, the resulting RAM die must have a sufficiently narrow width to fit into the package.

A number of RAM architectural approaches have been presented in the prior art. The article "A 60 ns 256K×1 Bit DRAM Using LD3 Technology and Double-Level Metal Interconnection" *IEEE Journal of Solid-State Circuits*, Vol. SC-19, No. 5, October 1984 by Kertis et al., discloses a DRAM having a first and second array, the bit lines of which are shared by a bank of sense amplifiers by the operation of enable passgates. The bit lines are equalized (equilibrated) and precharged by circuitry at ends of bit lines, opposite to the sense amplifiers. Accordingly, area must be dedicated at the ends of the array for precharge and equalization circuits.

"25-ns 256k×1/64k×4 CMOS SRAM's" *IEEE Journal of Solid-State Circuits*, Vol. SC-21, No. 5, October 1986 by Kayano et al., discloses an SRAM having upper and lower arrays that share a sense amplifier. The arrays are coupled to the sense amplifier by a decoding scheme. Equalization of the bit lines occurs at the ends of bit lines, opposite to the sense amplifiers. In addition to consuming area on the edge of the arrays, with precharge circuits, the decoding section of Kayano et al. consumes valuable area between the arrays.

U.S. Pat. No. 4,379,342 issued to Nakano et al. on Apr. 5, 1983 discloses a DRAM architecture having sense amplifier groups between memory cell groups to form memory blocks. A common column decoder is situated between memory blocks, or at the outer side of a memory block, and provides column lines to the memory blocks.

U.S. Pat. No. 5,384,726 issued to Tomira et al. on Jan. 24, 1995 discloses a DRAM architecture having multiple arrays, each array having segmented drive lines and trunks for supplying power to the segmented drive lines. The trunks are perpendicular to the word lines, and are driven by drivers located at opposing ends of the array. Tomira et al. also discloses a bank of sense amplifiers that are multiplexed between two arrays by selection circuits. Tomira et al. is silent as to the location of reference voltage, precharge, and equalization circuits, and employs large mink lines with decreasing width. The arrangement of Tomira et al. requires area be dedicated on opposing sides of the array for driver circuits and large trunk lines.

U.S. Pat. No. 5,535,172 issued to Reddy et al. on Jul. 9, 1996 discloses a RAM architecture wherein local bit lines from two different arrays are selectively coupled to global bit lines by a decoded timing signal.

Commonly owned, co-pending U.S. patent application Ser. No. 670,912 discloses a RAM having selective fast activation of sense amplifiers within a given group of sense amplifiers.

It would be desirable to provide a high density RAM architecture that provides booth a compact architecture and a fast access time.

SUMMARY OF THE INVENTION

It is an object of the present invention to provide a high density RAM architecture.

It is another object of the present invention to provide a RAM architecture having a fast data access time.

It is another object of the present invention to provide a RAM architecture having a very compact sense and select circuit for multiple arrays.

It is another object of the present invention to provide a RAM architecture having multiple arrays that requires minimal space on the periphery of the arrays for sensing and decoding circuits.

According to the present invention, a RAM architecture includes a number of memory cell arrays, each array having memory cells arranged in rows and columns. A sensing and select circuit is disposed parallel to the memory cell rows, between pairs of arrays. The arrays are coupled to the sense and select circuit by banks of decoded transfer gates. Column decoding circuits and sense timing circuits are located remotely from the sense and select circuits, and provide select and sense timing signals thereto by way of timing lines and column select lines that extend over the arrays, in the column direction, making contact with multiple sense and select circuits.

According to one aspect of the invention, both column select lines and sense timing lines are fabricated from the same conductive layer, and run parallel with one another over the arrays.

According to another aspect of the present invention, the column decoding circuits are located remotely from the sense timing circuits.

According to another aspect of the present invention, the column decoding circuits are located remotely from the sense timing circuits and only a selected groups of sense amplifiers within the sense timing circuits are activated when a given memory address is applied. According to another aspect of the present invention, the sense and select circuits include bit lines precharge and equalization circuits.

According to another aspect of the present invention, each array includes a number of bit line pairs, the bit line pairs from one array being coupled to a sense and select circuit by one bank of transfer gates, the bit line pairs from another array being coupled to the sense and select circuit by another bank of transfer gates. Bit line pairs from the two arrays share sensing and precharge circuits, each bit line pair having its own equalization circuit.

According to another aspect of the present invention power bus lines extend over the array between column select lines.

An advantage of the present invention is that a single column decoding bank, can provide sense and column select signals to multiple banks sense amplifier/column select circuits.

Another advantage of the present invention is that provides a compact power bussing scheme that eliminates the need to route power lines in from the periphery of the RAM device.

Another advantage of the present invention is that it eliminates the need to run column select lines parallel to column select banks.

Other objects and advantages of the present invention will become apparent in light of the following description thereof.

DETAILED DESCRIPTION OF THE EMBODIMENTS

Figure 1:
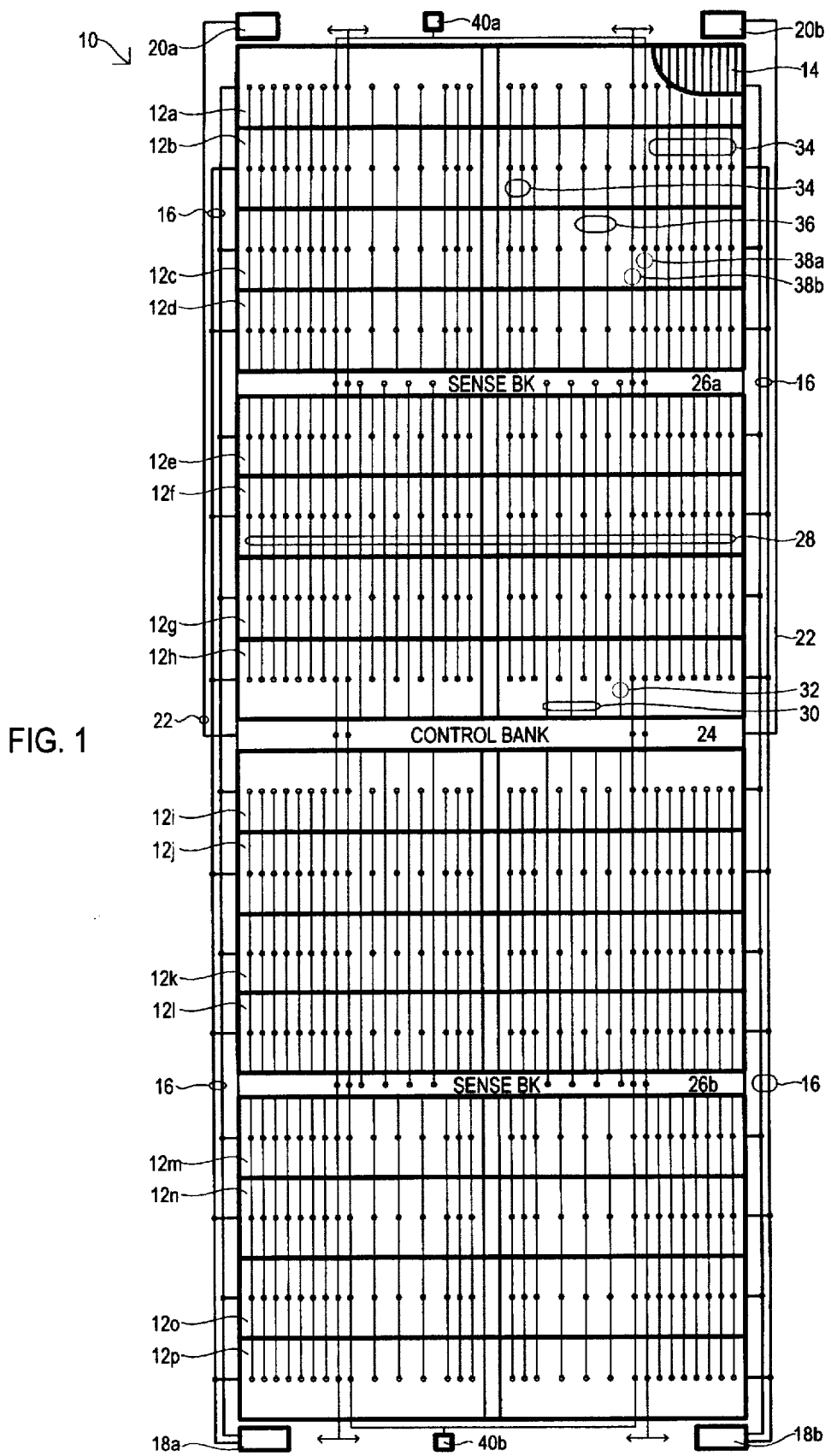
FIG. 1 is a top plan view of a DRAM architecture according to a preferred embodiment of the present invention.

FIG. 1 sets forth, generally, a dynamic random access memory (DRAM) according to a preferred embodiment of the present invention. The DRAM is designated by the general reference character 10 and is shown to include a number of core arrays 12a–12p. Each core array (12a–12p) includes a predetermined number of memory cells (1 Megabit for example). The memory cells in each core array are arranged in rows and columns with the memory cells being commonly coupled in row direction by one or more word lines, and commonly coupled in the column direction by one or more bit lines. A portion of core array 12a is set forth in a cut away fashion in FIG. 1, to illustrate the orientation of the bit lines 14 within the core array 12a. It is to be understood that each of the core arrays (12a–12p) also includes sensing and selection circuitry (not shown in FIG. 1) to access and/or sense selected cells within the core array (12a–12p) in response to select and timing signals.

Data are read from or written to each of the core arrays (12a–12p) by way of I/O lines 16. In FIG. 1, the I/O lines 16 are shown to extend from the outward sides of each core array (12a–12p) and run along the side of the DRAM 10, terminating in data I/O circuits 18a and 18b. It is understood that I/O lines 16 can be shared according to RAM configuration. In the particular embodiment set forth in FIG. 2, core arrays (12a, 12c, 12e, 12g, 12i, 12k, 12m, 12o) are commonly connected, while core arrays (12b, 12d, 12f, 12h, 12j, 12l, 12n, 12p) are commonly connected. Each I/O line 16 set forth in FIG. 1, includes four lines, resulting in the DRAM 10 having a "by sixteen" configuration. Of course, other configurations could be arrived at by one skilled in the art. The data I/O circuits 18a and 18b, according to well understood techniques, buffer signals on the I/O lines 16.

The DRAM 10 includes input buffer circuits 20a and 20b for receiving externally applied memory address, timing, and control signals, and applying these signals the along input lines 22. As set forth in FIG. 1, the input lines 22 are coupled to a control bank 24 disposed between adjacent core arrays 12h and 12i. In response to the memory address and the timing and control signals, the control bank 24 generates predecode signals and timing signals for use at other locations in the DRAM 10. According to well understood techniques, a first level of decoding is performed on an applied memory address, resulting in a number of predecode signals. In the preferred embodiment, the DRAM 10 is an asynchronous device, and so generates timing (clock) signals in response to a row address strobe (/RAS) and a column address strobe (/CAS) signal. Of course, one skilled in the art would recognize that a synchronous device would be responsive to an externally applied system clock.

Also situated between the core arrays (12a–12p) are a first column decode bank 26a and a second column decode bank 26b. In the particular embodiment of FIG. 1, the first column decode bank 26a is situated between core arrays 12d and 12e, and the second column decode bank 26b is situated between core arrays 12l and 12m. Each column decode bank (26a and 26b) generates the necessary select sense signals to access selected memory cells from within one or more associated core arrays. In the particular architecture of FIG.

1, the first column decode bank 26a is associated with core arrays 12a–12h, while the second column decode bank 26b is associated with core arrays 12i–12p.

Disposed over the core arrays (12a–12p) are a number of driver lines 28 running generally parallel to the bit lines 14. Unlike approaches of the prior art, a number of different types of driver lines are provided. Included among the driver lines 28 are predecode lines 30, clock lines 32, column select lines 34, sense driver lines 36, first bus lines 38a, and second bus lines 38b. The predecode lines 30 and clock lines 32 couple predecode signals and clock signals, respectively, from the control bank 24 to each column decode bank 26a and 26b. The column select lines 34 and sense driver lines 36 couple sense and select signals from each column decode bank (26a or 26b) to its respective core arrays (12a–12p). The first bus lines 38a extend from a first supply circuit 40a along substantially the entire length of the DRAM 10, making periodic contact with the DRAM 10. Similarly, the second bus lines 38b extend from a second supply circuit 40a along substantially the entire length of the DRAM 10, making periodic contact therewith. The supply circuits (40a and 40b) provide supply potential to various portions of the DRAM 10. Connection from the various driver lines 28 (including 30, 32, 34 and 36) to underlying portions of the DRAM 10 are designated by circular contact marks. The various driver lines 28 provide a shortest distance, low resistance path between the various control signal generating circuits and those circuits that are driven by the control circuits. For example, the driver lines 28 provide such a path between the control bank 24 and the column decode banks (26a and 26b), and between the column decode banks (26a and 26b) and their associated core arrays (12a–12p). Further, the running of bus lines (38a and 38b) over the core arrays (12a–12p) provides a convenient power supply to the various circuits within central portions of the core arrays (12a–12p) and control banks (24, 26a and 26b), eliminating the need to run bus lines into such locations from the periphery of the core arrays (12a–12p).

Referring once again to FIG. 1, the general operation of the preferred DRAM embodiment will be discussed. In a read operation, address information and timing information is applied in the well know multiplexed fashion. A row address in conjunction with the /RAS signal is applied via external pins and coupled to the control bank 24 by way of the input lines 22. Subsequently, a column address in conjunction with a /CAS signal is coupled to the control bank 24. In response to the /RAS signal, the control bank 24 generates clock signals which are coupled via clock lines 32 to first and second column decode banks (26a and 26b). The column decode banks (26a and 26b) then generate sense signals which are coupled to selected core arrays (12a–12p) by way of sense driver lines 36. In response to the column address, the control bank 24 generates predecode signals which are coupled, via predecode lines 30 to the column decode banks (26a and 26b) which, in turn, generate column select signals. The column select signals are coupled to selected core arrays (12a–12p) by way of column select lines 34. In the event of a read operation the selected core arrays place memory cell data on the I/O lines 16, and the data I/O circuits 18a and 18b drive data pins accordingly. In the event of a write operation, the I/O lines 16 are driven by write amplifiers in the data I/O circuits 18a and 18b, and data is written into selected cells according to the memory address.

In the preferred embodiment, the pitch of the column select lines 34 is greater than that of the bit lines 14, allowing for predecode lines 30, clock lines 32 and sense driver lines 36 to be interspersed between column select lines 34. It is understood that FIG. 1 is not drawn to scale, and the particular arrangement of the driver lines 28 should not be construed as limiting the invention thereto.

The arrangement of column select lines 34 that extend from the column decode banks (26a and 26b) in a direction parallel to the bit lines, completely eliminates the need, present in many prior art approaches, for column select lines ("Y select") lines that run perpendicular to the bit lines, over column select circuitry within the core arrays. This enables core arrays (12a–12p) of the present invention to be more compact than the prior art.

Figure 2:
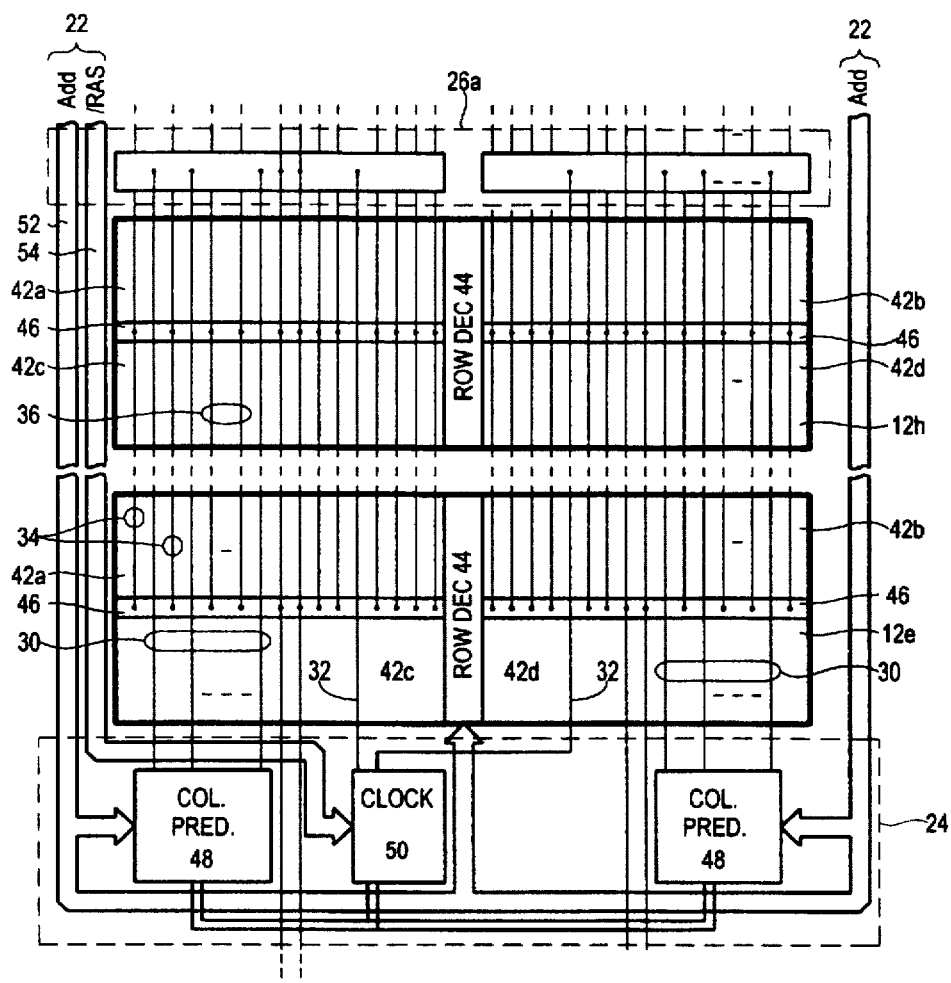
FIG. 2 is block diagram illustrating two core arrays and a portion of the control bank and column decode bank of the embodiment set forth in FIG. 1.

Referring now to FIG. 2, a portion of the DRAM 10 is provided in more detail. FIG. 2 sets forth core array 12e and 12h, in addition to portions of input lines 22 and control bank 24. The core arrays (12e and 12h) are shown to each include for quadrants 42a–42d. Each of the quadrants (42a–42d) includes memory cells arranged in rows and columns accessed by bit lines and word lines. The quadrants (42a–42d) are separated from one another by row decoders 44 and sense banks 46. In response to an applied row address, the row decoders 44 drive selected word lines in the quadrants (42a–42d). Row decode and word line driving circuits are well understood in the art and so will not be discussed in any further detail herein.

The control bank 24 is shown to include a column predecode circuits 48 and a clock circuit 50. The column predecode circuits 48 receive address information by way of address lines 52 included within input lines 22, and in response thereto, drive the predecode lines 30 with predecode signals. The clock circuit 50 receives clock information by way of/RAS line 54 included within input lines 22, and in response thereto drives clock lines 32 with the signal, i/RAS. The clock lines 32 and predecode lines 30 extend in the column direction and are coupled to the first column decode bank 26a. The clock lines 32 and predecode lines 30 also extend in the direction away from the first column decode bank 26a and make contact with the second column decode bank 26b (not shown in FIG. 2).

The first column decode bank 26a generates sense amplifier enable signals, SA and /SA, in response to the i/RAS signal, and applies them via sense driver lines 36 to the sense banks 46 of its associated core arrays (12a–12h). In a similar manner, the first column decode bank 26a generates numerous column select signals in response to the column predecode signals and applies them via column select lines 34 to the sense banks 46 of its associated core arrays (12a–12h). It is understood that the second column select bank operates in the same fashion, supplying SA, /SA, and column select signals to the sense banks of its respective core arrays. It is also understood that FIG. 1 is not drawn to scale, and the particular arrangement of the column select lines should not be construed as limiting.

Referring once again to FIG. 2, in operation, the portion of the DRAM 10 shown receives a /RAS signal on /RAS line 54. Concurrently, a row address is received on address lines 52. The row address 52 is predecoded and coupled to the row decoders 44 which activate a given word line (not shown in FIG. 2) coupling memory cells to bit lines (also not shown in FIG. 2). The clock circuit generates the i/RAS signal which, in turn generates the SA and /SA signals. The SA and /SA signals activate the sense banks 46 which amplify the data signals on the bit lines. A column address signal is then applied via address lines 52. The column predecoder circuits 48 apply column predecode signals to the first column decode 26a which generates column select signals which are coupled to the sense banks 46. In response to the column select signals, the sense banks 46 couple selected amplified data signals to I/O lines (not shown in FIG. 2).

Figure 3:
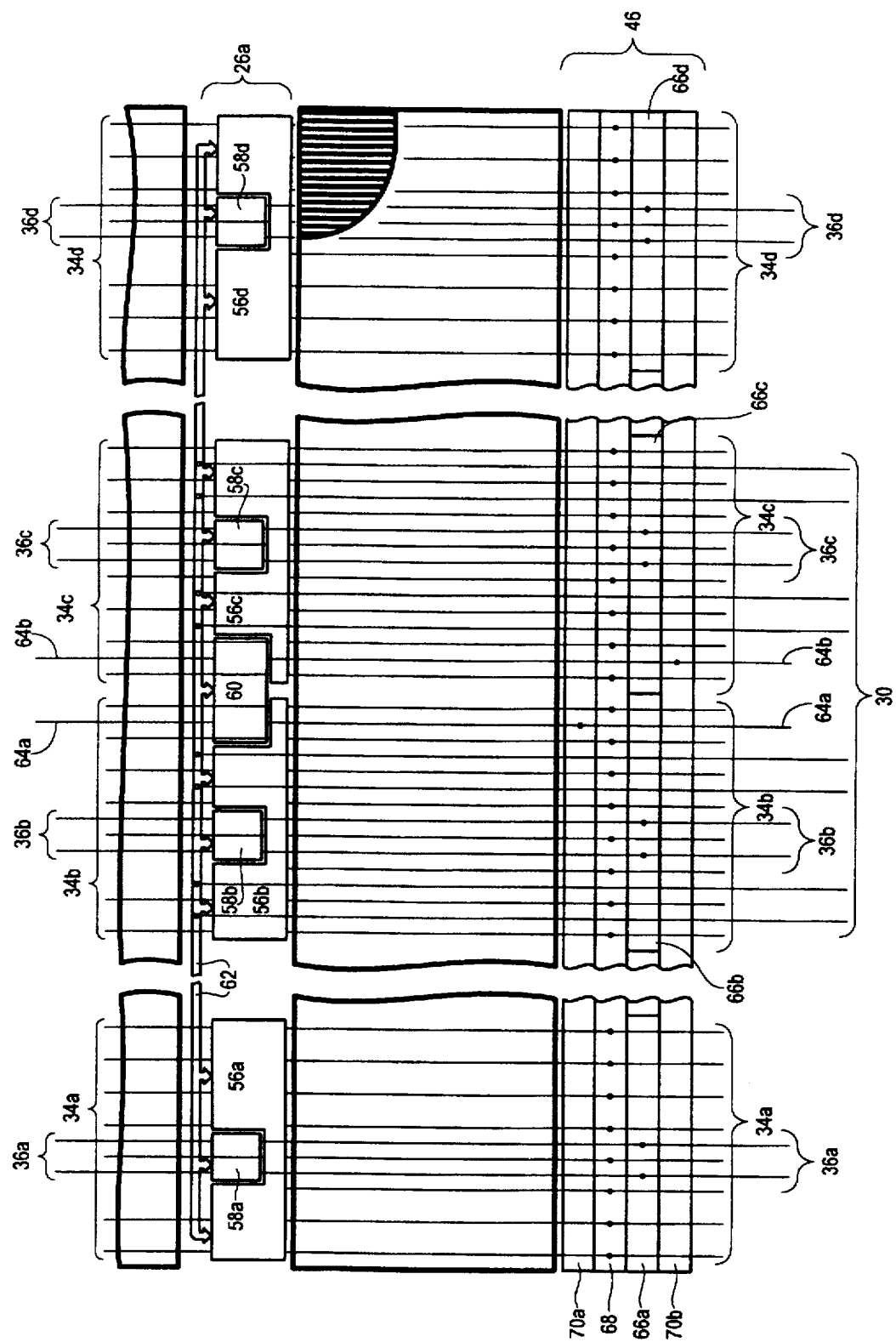
FIG. 3 is top plan view illustrating a portion of the column decode bank and sense banks of the embodiment set forth in FIG. 1.

Referring now to FIG. 3, a portion of the first column decode bank 26a, a portion of the sense bank 46, and quadrant 42a are set forth in a top plan view. The first column decode bank 26a is shown to include column decoders 56a–56d, sense amplifier drive circuits 58a–58d, decoded transfer gate drive circuit 60, and predecode bus 62. The column decoders (56a–56d) generate the column select signals in response to column predecode signals on the column predecode bus 62. The sense amplifier drive circuits 58a–58 generate the SA and /SA signals in response to the i/RAS signal. Further, in the preferred embodiment, the column decoders (56a–56d) and sense amplifier drive circuits (58a–58d) can be conceptualized as being divided into sections, with each section driving eight (8) column select lines 34 and two sense driver lines 36 (SA and /SA). In FIG. 3, the letters following the reference character indicates items of like sections (i.e., 34a, 56a and 58a are of the same section, 34b, 56b and 58b are of the same section). The decoded transfer gate drive circuit 60 generates a transfer gate select signal based on predecode signals. The transfer gate select signals are driven on transfer gate drive lines 64a and 64b.

Referring once again to FIG. 3, the various portions of the sense bank 46 are set forth. The sense bank is shown to center around sense amplifier groups 66a–66d. As in the case of the column decoders (56a–56d) and sense amplifier drive circuits (58a–58d), each sense amplifier group (66a–66d) corresponds to a section, with sense amplifier groups 66a–66d receiving SA and /SA signals from sense amplifier drive circuits 58a–58d, respectively. The sense amplifier groups (66a–66d) amplify data signals when activated by the SA and /SA signals. Running adjacent to the sense amplifier groups (66a–66d) is a column select bank 68. The column select bank 68 couples amplified data from the sense amplifier groups (66a–66d) to I/O lines (not shown in FIG. 3) according to column select signals provided on column select lines 34a–34d. Situated between quadrant 42a and the column select bank 68 is a first transfer gate bank 70a. In response to an active transfer gate select signal on transfer gate drive line 64a, the first transfer gate bank 70a couples the bit lines of quadrant 42a to the sense amplifier groups (66a–66d). Situated between the sense amplifier groups (66a–66d) and quadrant 42b (not shown in FIG. 3) is a second transfer gate bank 70b. In response to an active transfer gate select signal on transfer gate drive line 64b, the bit lines of quadrant 42b are coupled to the sense amplifier groups (66a–66d). In this manner the sense amplifier groups (66a66d) are shared by two quadrants. In the preferred embodiment, each sense bank 46 includes thirty-two (32) sense amplifier groups (66a–66b), with each sense amplifier group (66a–66d) including thirty-two (32) sense amplifiers. It is understood that the particular area and locations of the elements within the first column decode bank 26a and the sense bank 46 as set forth in FIG. 3, are provided to aid in the understanding of the present invention, and should not be construed as limiting the invention thereto.

Figure 4:
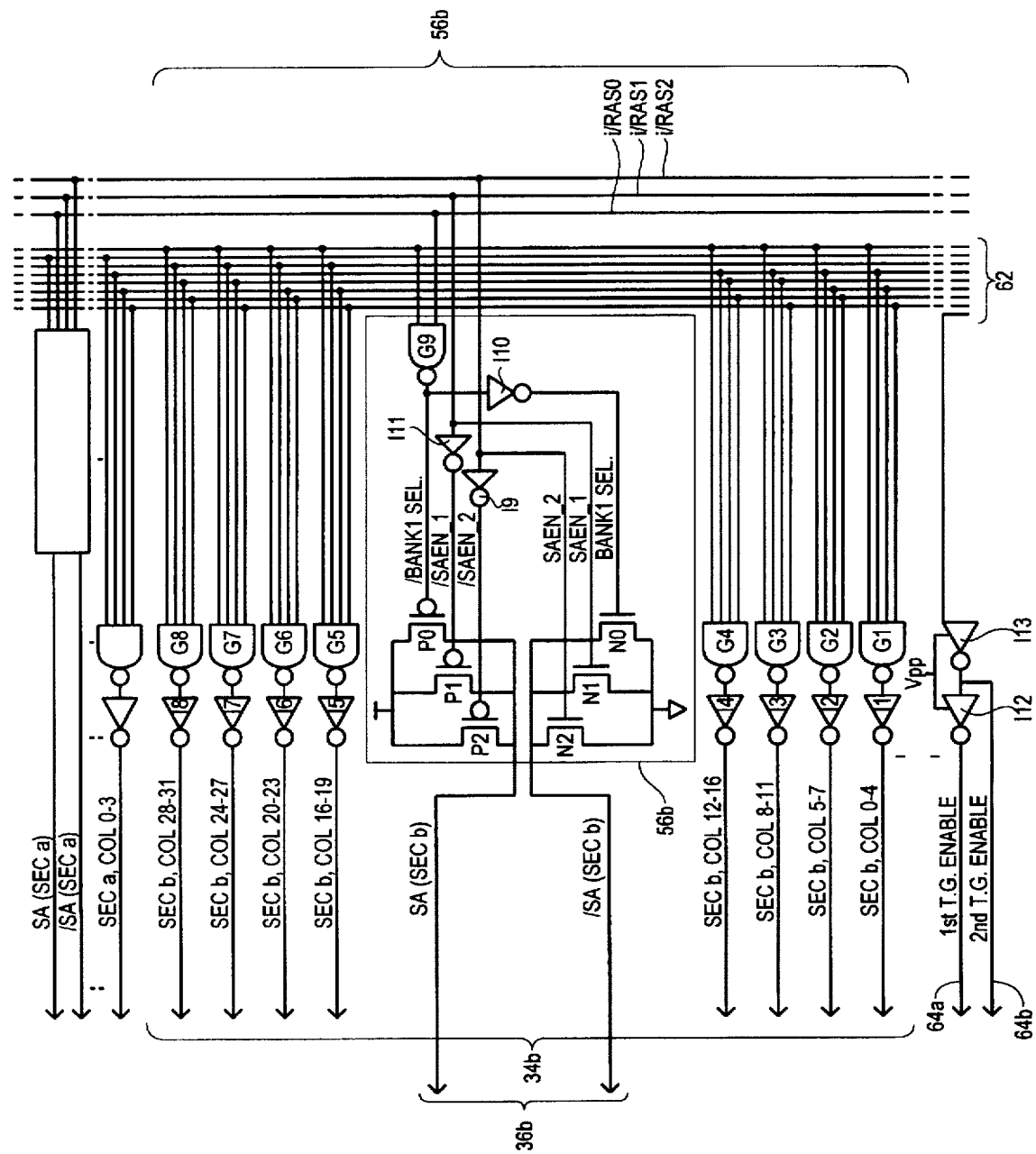
FIG. 4 is a schematic diagram illustrating the column decoders and sense amplifier drive circuits of the embodiment set forth in FIG. 1.

Referring now to FIG. 4, a schematic diagram is set forth illustrating the column decoders 56b and sense amplifier drive circuit 58b set forth in FIG. 3. The column decoder 56b is shown to include eight NAND gate/inverter pairs (G1/I1–G8/I8). Each NAND gate/inverter pair receives four predecode signals from the predecode bus 62 to drive one of the column select lines 34b with a column select signal. Each column select line 34b selects four columns in its associated quadrant 42. Further, in the preferred embodiment, there are thirty-two columns associated with each section. Accordingly, if the predecode signals on predecode bus 62 activated NAND gate/inverter pair G4/I4, columns 12–14 of the 32 columns would be coupled to four I/O lines (not shown).

The sense amplifier drive circuit 58b is shown to include a decode gate G9, three inverters, I9-I11, three pull-up devices P0–P2 and three pull-down devices N0–N2. Devices P0 is larger than P1 and P2. Similarly, device N0 is larger than N1 and N2. In the preferred embodiment, the sense amplifier drive circuit 58b receives three timing signals i/RAS0, i/RAS1 and i/RAS2, each being generated in the that order (i.e., i/PAS0 precedes i/PAS1). The signal i/PAS0 is decoded via G9 with a section predecode signal from predecode bus 62. Signals i/PAS1-i/RAS2, and there compliments, are coupled directly to devices P1–P2 and N1–N2. In this manner, when data is to be read from a given section, the sense amplifier group (66a–66d) of that section will be driven faster by operation of P0 and N0 in conjunction with P1–P2 and N1–N2. The remaining sense amplifier groups (66a–66d) will be driven slower by operation of P1–P2 and N1–N2 only. The selective activation of one group of seine amplifiers within a sense bank reduces the amount of noise generated by sense amplifier switching action. Further, less power is consumed, as only the selected group will be driven by the large pull-up and pull-down devices.

Referring once again to FIG. 4, the transfer gate driver lines 64a and 64b are shown to be driven by boost inverters I12 and I13. These inverters provide a positive voltage (Vpp) greater than the positive supply voltage of the DRAM 10. The generation of Vpp levels, particularly for driving word lines in DRAM arrays is well understood in the art.

Figure 5:
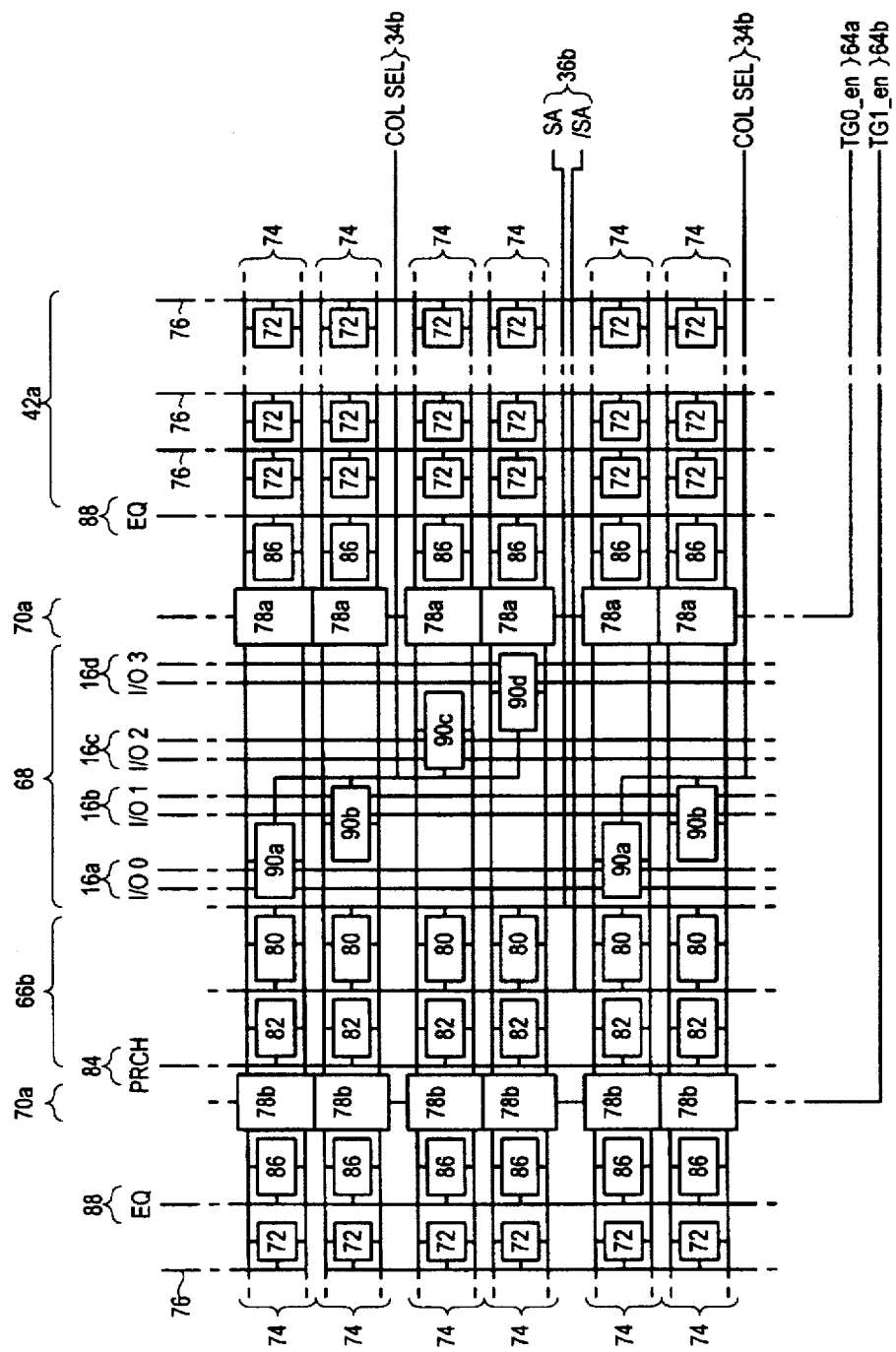
FIG. 5 is block plan view of a portion of a sense bank according to the present invention.

FIG. 5 sets forth a portion of the sense bank 46 according to one embodiment of the present invention. Quadrant 42a is shown to include a number of memory cells 72 arranged in an array of rows and columns. All the cells in the same column are coupled together by bit line pairs 74. All the cells in the same row are coupled together by word lines 76. The first transfer gate bank 70a of the embodiment set forth in FIG. 5, is shown to include a first transfer gate 78a corresponding to each bit line pair 74. The first transfer gates 78a are commonly driven by a transfer gate select signal on first transfer gate drive line 64a. When driven, the first transfer gates 78a provide a low impedance path between their respective bit line pair 74 and a sense amplifier 80. In a similar fashion, the second transfer gate bank 70b of the embodiment set forth in FIG. 5 includes a second transfer gate 78b corresponding to each bit line pair 74 of the opposing quadrant (42b). The second transfer gates 78b are commonly driven by the second transfer gate drive line 64b to provide a low impedance path between its respective bit line pairs 74 and the sense amplifiers 80.

The sense amplifier group 66b of FIG. 5 is shown to include the sense amplifiers 80. In addition, unlike prior art approaches, each sense amplifier 80 has an associated precharge circuit 82. The sense amplifiers 80 are commonly driven by sense driver lines 36b which carry the SA and /SA signal. When driven, each sense amplifier 80 amplifies a voltage differential across its sense nodes, the voltage differential being provided by a first or second transfer gate 78a or 78b coupling its bit line pair 74 to the sense nodes. The precharge circuits 82 precharge the sense nodes of their associated sense amplifier 80 to a reference voltage in response to a precharge signal on precharge signal line 84. The placement of the precharge circuits 82 within the sense bank 46 provides a compact sensing circuit arrangement, and in addition, eliminates the need to place such devices at the opposite ends of the core arrays (12a–12p), freeing up valuable peripheral area.

The sense bank 46 set forth is FIG. 5 also includes equalization circuits 86. In the preferred embodiment, equalization circuits 86 are provided outside the first and second transfer gates 78a and 78b. The equalization function could be brought within the first and second transfer gates 78a and 78b, with one equalization circuit being associated with the sense nodes of each sense amplifier 80. However, the dual equalization arrangement of FIG. 5 advantageously eliminates any impedance drop introduced by the first or second transfer gates 78a and 78b that would result in a lower than expected equalized potential on the bit line pairs 74. The equalization circuits 86 are commonly driven by equalization drive lines 88.

The column select bank 68 according to a preferred embodiment is also illustrated in FIG. 5. The column select bank 68 is shown to include groups of four column passgates 90a–90d for connecting groups of four sense amplifiers 80 to four I/O line pairs 16a–16d. The groups of column passgates (90a–90d) are commonly driven by a different column select line 34b. This arrangement advantageously allows fast activation of the column passgates (90a–90d) due to the low resistance, short distance column select lines 34b. At the same time, the arrangement produces a column select line-to-memory cell column ratio that is greater than one (four in the particular embodiment of FIG. 5). This allows other drive lines (sense driver lines, clock lines, predecode lines, etc.) to fit within the pitch of the column select lines.

Figure 6:
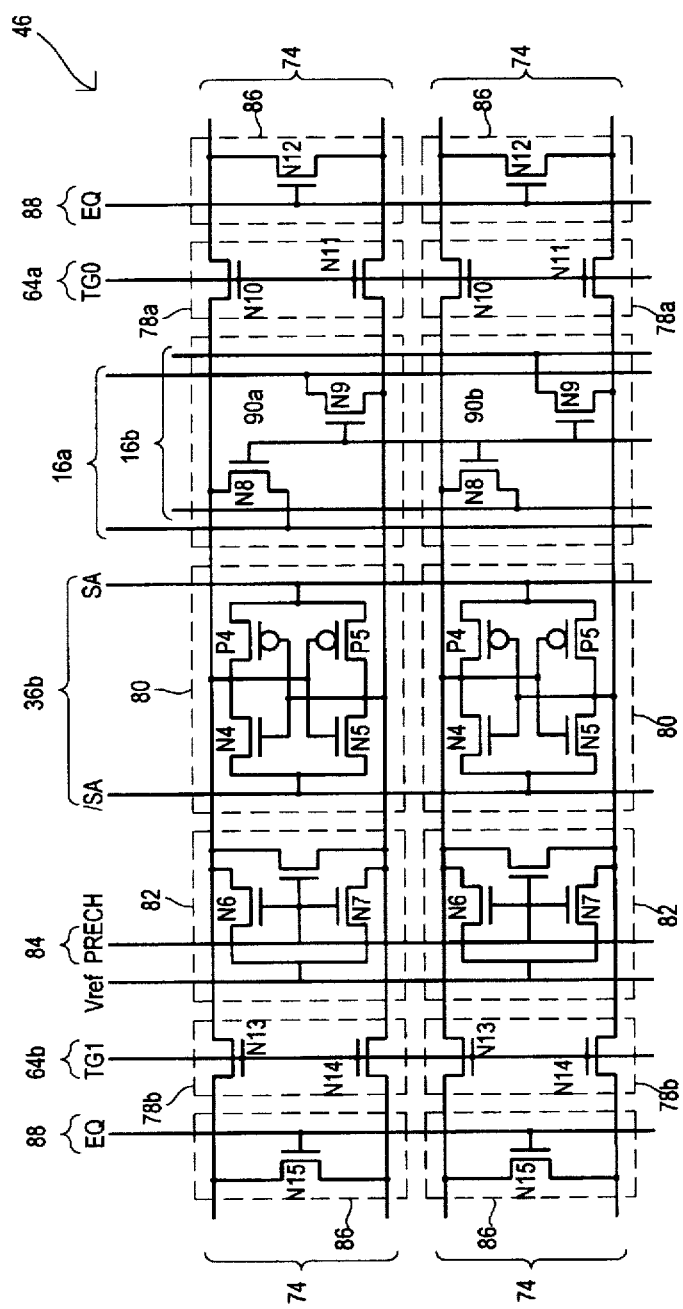
FIG. 6 is schematic diagram setting forth a portion of a sense bank according to the preferred embodiment.

FIG. 6 sets forth a schematic diagram illustrating a portion of the sense bank 46 according to a preferred embodiment. The equalization circuits 86 are shown to include n-channel, insulated gate field effect (NMOS) transistors N15 and N12 coupled between their respective bit line pairs 74 along their source-drain paths. the gates of N15 and N12 are commonly driven by equalization drive lines 88. The first transfer gates 78a are shown to be pairs of NMOS transistors N10 and N12 which couple their bit line pair to the sense nodes of the sense amplifiers 80. Similarly, the second transfer gates 78b are shown to include NMOS pairs N13 and N14. The transfer gate drive lines 64a and 64b commonly drive the gates of the transistors within each transfer gate (78a and 78b). As will be recalled, in the preferred embodiment, the transfer gate enable signal is a boosted (Vpp) signal. Accordingly, the threshold voltage drop across N10/N11 and N13/N14 is eliminated when the bit line pairs 74 are coupled to the sense amplifiers 80. Each sense amplifier 80 is shown to include a pair of p-channel insulated gate field effect (PMOS) transistors, P4 and P5, and a pair of NMOS transistors, N4 and N5. The transistor pairs are cross coupled across the sense nodes of the sense amplifier 80. The SA signal is shown to drive the common sources of P4 and P5. The /SA signal is shown to drive the common sources of N1 and N2. The precharge circuit 82 includes three NMOS transistors N6, N7 and N16. N16 is coupled across the sense nodes by its source drain path. N6 and N7 each couple one of the sense nodes to a reference potential, provided along reference line 92. The gates of N6, N7 and N16 are commonly driven by precharge signal drive line 84. Two column passgates (30a and 90b) are also set forth in FIG. 6. In the preferred embodiment, the column passgates (90a and 90b) include a pair of NMOS devices, N8 and N9. The source drain paths of N8 and N9 are connected between one of the sense nodes, and one I/O line of an I/O line pair 14a. Only two of the four I/O line pairs (14a and 14b) are set forth in FIG. 6, for clarity of illustration.

Figure 7:
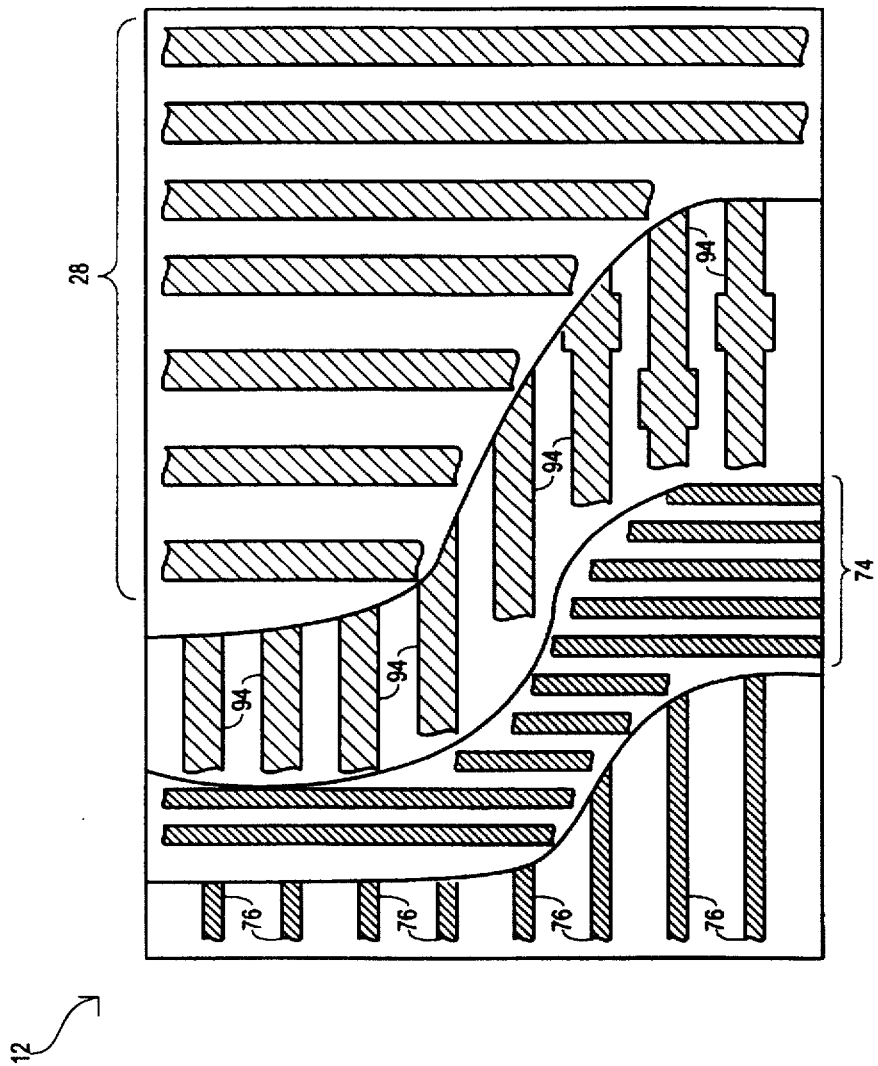
FIG. 7 is a cutaway view of a portion of a DRAM according to a preferred embodiment of the present invention.

Referring now to FIG. 7, a cutaway view of a portion of a core array 12 is set forth to illustrate the preferred interconnection arrangement of the present invention. The word lines 76 are formed from a first layer of doped polysilicon. Bit line pairs 74 are formed from a second layer of doped polysilicon. The bit line pairs 74 are situated over, and insulated from, the word lines 76 (it being understood that each bit line pair drops down to the substrate of the DRAM to make contact with the cells of its respective column). Word line strap members 94 are situated over, and insulated from the bit line pairs 74. The word line strap members 94 are formed from a first layer of metallization and periodically extend downward toward the substrate, between bit line pairs 74 and make contact with associated word lines 76. The word line strap members 94 are driven by row decoders, and due to their low resistance, provide fast activation of the word lines 76. The driver lines 28 (which can include any of the column select lines, clock lines, sense driver lines, and bus lines) are situated over, and insulated from the word line strap members 94. The driver lines 28 are formed from a second layer of metallization to provide low resistance connections between various portions of the DRAM 10, as previously described.

It is understood that the embodiments set forth herein are only some of the possible embodiments of the present invention, and that the invention may be changed, and other embodiments derived, without departing from the spirit and scope of the invention. Accordingly, the present invention is intended to be limited only by the appended claims.

What is claimed is:

1. In a random access memory device for storing and outputting data in response to memory address signals, a compact, fast access architecture, comprising:

a first array of memory cells including a plurality of first array columns, each first array column including a plurality of memory cells commonly coupled to at least one first array bit line, the first array bit lines being disposed in a column direction;

a second array of memory cells including a plurality of second array columns, each second array column including a plurality of memory cells commonly coupled to at least one second array bit line, the second array bit lines being disposed in the column direction;

a first seine amplifier bank disposed between said first array and said second array coupled to the first array bit lines and to the second array bit lines, said first sense amplifier bank including a plurality of first bank sense nodes and at least one first enable node, said first sense amplifier amplifying signals on the first bank sense nodes in response to a sense amplifier drive signal coupled to the at least one sense node;

a sense amplifier control circuit for receiving input control signals and generating therefrom the at least one sense amplifier drive signal;

a plurality of sense amplifier driving lines insulatively disposed over at least said first array in the column direction for coupling the at least one sense amplifier drive signal from said sense amplifier control circuit to the first enable node of said first sense amplifier bank;

a column select circuit disposed between said first and said second array for coupling selected first bank sense nodes to at least one input/output (I/O) line;

a column decoding circuit for receiving a plurality of column predecode signals and generating therefrom a plurality of column select signals; and a plurality of column select lines insulatively disposed over at least said first array in the column direction, interspersed between selected of said plurality of sense amplifier driving lines for coupling selected column select signals from said column decoding circuit to said column select circuit.

2. The compact, fast access architecture of claim 1, wherein:

said sense control circuit includes at least one sense amplifier drive node and generates the at least one sense amplifier drive signal by coupling the sense amplifier drive node to a first potential in response to a clock signal; and said plurality of sense amplifier driving lines couples the at least one sense amplifier drive node to the at least one first enable node.

3. The compact, fast access architecture of claim 2, wherein:

the first array bit lines of said first array are formed from a bit line conductive layer;

the second array bit lines of said second array are formed from the bit line conductive layer; and the sense amplifier driving lines are formed from conductive layer other than the bit line conductive layer.

4. The compact, fast access architecture of claim 3, wherein:

said first array includes word lines that are formed from a first conductive layer that includes polycrystalline silicon, the bit line conductive layer is a second conductive layer that includes polycrystalline silicon; and said sense amplifier driving lines are formed from a metallization layer.

5. The compact, fast access architecture of claim 4, wherein:

the word lines of said first array and said second array includes metallization straps formed from a metallization layer other than that used to form said sense amplifier driving lines.

6. The compact, fast access architecture of claim 2, wherein:

the first array bit lines of said first array are formed from a bit line conductive layer;

the second array bit lines of said second array are formed from the bit line conductive layer; and the column select lines are formed from conductive layer other than the bit line conductive layer.

7. The compact, fast access architecture of claim 2, including:

said first sense amplifier bank includes a plurality of sections, each section including a plurality of sense amplifiers and a section sense enable node;

said sense amplifier timing circuit includes a sense amplifier section decode circuit responsive to the at least one clock signal and at least one memory address signal for coupling selected section drive nodes to the first potential; and said plurality of sense amplifier driving lines includes a plurality of decoded driving line for coupling at least one section drive node to the section sense node of at least one section of said first sense amplifier bank.

8. The compact, fast access architecture of claim 7, wherein:

said first array includes word lines that are formed from a first conductive layer that includes polycrystalline silicon, the bit line conductive layer is a second conductive layer that includes polycrystalline silicon; and said column select lines are formed from a metallization layer.

9. The compact, fast access architecture of claim 8, wherein:

the word lines of said first array and said second array includes metallization straps formed from a metallization layer other than that used to form said sense amplifier driving lines.

10. The compact, fast access architecture of claim 2, wherein:

said sense amplifier timing circuit is responsive to a first clock signal for coupling the at least one sense amplifier drive node to the first potential via a first impedance path, and for coupling the at least one sense amplifier drive node to the first potential via a second impedance path.

11. The compact, fast access architecture of claim 10, wherein:

said first sense amplifier bank includes a plurality of sections, each section including a plurality of sense amplifiers and a section sense enable node; and said sense amplifier timing circuit is further responsive to at least one memory address signal and couples selected section drive nodes to the first potential via at least one first impedance path; and said plurality of sense amplifier driving lines includes a plurality of decoded driving line for coupling at least one section drive node to the section sense enable node of at least one section of said first sense amplifier bank.

12. The compact, fast access architecture of claim 1, including:

a bank decoder for generating a plurality of bank select signals in response to at least one memory address signal;

a first bank of decoded transfer gates for coupling a plurality of first array bit lines to said first sense amplifier bank in response to at least a first of the bank select signals; and a second bank of decoded transfer gates for coupling a plurality of second array bit lines to said first sense amplifier bank in response to at least a second of the bank select signals.

13. The compact, fast access architecture of claim 12, wherein:

said first bank of decoded transfer gates is disposed between said first array and said second array, intermediate said first sense amplifier bank and said first array; and said second bank of decoded transfer gates is disposed between said first and array and said second array, intermediate said first sense amplifier bank and said second array.

14. The compact, fast access architecture of claim 12, wherein:

said column select circuit is disposed between said first bank of decoded transfer gates and said second bank of decoded transfer gates.

15. The compact, fast access architecture of claim 13, including:

said first array includes at least two opposing sides;

said first sense amplifier bank is situated proximate to one side of said first array;

said bank decoder is disposed proximate to other side of said first array opposite to said first bank of sense amplifiers; and a plurality of bank decoder lines insulatively disposed over at least said first array in the column direction, the bank decoder lines coupling the plurality of bank select signals to at least said first and second banks of decoded transfer gates.

16. The compact, fast access architecture of claim 1, including:

said first sense amplifier bank includes a plurality of sections, each section including a plurality of sense amplifiers and a section sense enable node;

said sense amplifier timing circuit is further responsive to at least one memory address signal and couples selected section drive nodes to the first potential via at least one first impedance path; and said plurality of sense amplifier driving lines includes a plurality of decoded driving lines for coupling at least one section drive node to the section sense enable node of at least one section of said first sense amplifier bank.

17. The compact, fast access architecture of claim 1, including:

a third array of memory cells including a plurality of third array columns, each third array column including a plurality of memory cells commonly coupled to at least one third array bit line, the third array bit lines being disposed in the column direction;

a fourth array including a plurality of fourth array columns, each fourth array column including a plurality of memory cells commonly coupled to at least one fourth array bit line, the fourth array bit lines being disposed in the column direction;

a second sense amplifier bank disposed between said third array and said fourth array, and coupled to the third array bit lines and to the fourth array bit lines, said second sense amplifier bank having at least one second sense amplifier enable node, and being enabled by coupling the at least one second sense amplifier enable node to one of the sense amplifier drive signals;

said sense amplifier control circuit is disposed between said first array and said third array; and said plurality of sense amplifier driving lines are disposed over at least said first array and said third array in the column direction, and couple the at least one sense amplifier drive signal from said sense amplifier control circuit to the at least one first sense amplifier enable node of said first sense amplifier bank and the at least one second sense amplifier enable node of said second sense amplifier bank.

18. The compact, fast access architecture of claim 1, including:

a plurality of power bus lines insulatively disposed over at least said first array in the column direction, for coupling at least a first power supply to the random access memory device.

19. In a random access memory having a first and second array and of memory cells, each array of memory cells being arranged in rows and columns, the memory cells of each column being commonly coupled to at least one bit line, the memory cells of each row being commonly coupled to at least one word line, a sense and decoding scheme, comprising:

a plurality of first decoded transfer gates disposed between said first array and said second array, each first decoded transfer gate including at least one input terminal coupled to one bit line of the first array, at least one output terminal coupled a sense node, and a control terminal, each first decoded transfer gate providing a low impedance path between its input and output terminal in response to a first gate enable signal at its control terminal, the control terminals of said plurality of first decoded transfer gates being commonly connected;

a plurality of second decoded transfer gates disposed between said plurality of first decoded transfer gates and the second array, each second decoded transfer gate including at least one input terminal coupled to one bit line of the second array, at least one output terminal coupled to a sense node, and a control terminal, each second decoded transfer gate providing a low impedance path between its input and output terminal in response to a second gate enable signal at its control terminal, the control terminals of said plurality of second decoded transfer gates being commonly connected;

a plurality of sense amplifiers disposed between said plurality of first decoded transfer gates and said plurality of second decoded transfer gates, at least one sense amplifier being associated with at least one sense node and including a first power terminal and a second power terminal, each sense amplifier driving its respective sense node to a first or second logic state in response to a first power signal at its first power terminal and a second power signal at its second power terminal;

a plurality of data input/output (I/O) lines;

a plurality of data passgates disposed between said plurality of first decoded transfer gates and said plurality of second decoded transfer gates, each data passgate including at least one input terminal coupled to a sense node, at least one output terminal coupled to an I/O line, and a control terminal, each data passgate providing a low impedance path between its input and output terminal in response to a decoder signal on its respective control terminal; and a plurality of sense node prechargers disposed between said first plurality of decoded transfer gates and said second plurality of decoded transfer gates, each sense node precharger being associated with at least one sense node and including a reference terminal and precharge terminal, each sense node precharger coupling its respective sense node to the reference terminal in response to a precharge signal at its precharge terminal.

20. The a sense and decoding scheme of claim 19, wherein:

the memory cells of each column in each array are commonly coupled to at least one pair of bit lines;

each said first decoded transfer gate includes two input terminals coupled to one bit line pair of the first array, a pair of output terminals coupled to a pair of sense nodes, and a control terminal, each first decoded transfer gate providing a low impedance path between its two input terminals and its two output terminals in response to the first gate enable signal at its control terminal;

each said second decoded transfer gate includes two input terminals coupled to one bit line pair of the second array, a pair of output terminals coupled to a pair of sense nodes, and a control terminal, each first decoded transfer gate providing a low impedance path between its two input terminals and its two output terminals in response to the second gate enable signal at its control terminal;

said at least one sense amplifier being associated with at least one pair of sense node, and driving its respective sense node pair to opposing first and second logic states in response to the first power signal at its first power terminal and the second power signal at its second power terminal;

said plurality of I/O lines includes a plurality of I/O line pairs disposed between the first and second array generally parallel to the word lines of the array;

each said data passgate including a pair of input terminals coupled to a pair of sense nodes, a pair of output terminals coupled to an I/O line, and a control terminal, each data passgate providing a low impedance path between its pair of input and output terminals in response to the decoder signal on its respective control terminal; and each said sense node precharger is associated with a pair of sense nodes, and couples its respective pair of sense nodes to the reference terminal in response to the precharge signal at its precharge terminal.

21. The a sense and decoding scheme of claim 20, wherein:

each memory cell of the array includes transistors of a first conductivity type;

each said first decoded transfer gate includes a pair of insulated gate field effect (MOS) transistors of the first conductivity type having commonly coupled gates;

each said second decoded transfer gate includes a pair of MOS transistors of the first conductivity type having commonly coupled gates; and each said sense amplifier includes a pair of MOS transistors of the first conductivity type having sources commonly connected to the first power terminal with the gate and drain of each transistor being cross-coupled to opposing sense nodes, and a pair of MOS transistors of the second conductivity type having sources commonly coupled to the second power terminal with the gate and drain of each transistor being cross-coupled to opposing sense nodes.

22. The a sense and decoding scheme of claim 21, wherein:

the random access memory receives power from a first supply terminal at a first potential and second supply terminal at a second potential lower than the first potential;

each memory cell of the array includes n-channel MOS (NMOS) transistors;

the MOS transistors of each first decoded transfer gate are NMOS transistors and the first gate enable signal is greater than the first potential (Vpp); and the MOS transistors of each second decoded transfer gate are NMOS transistors the first gate enable signal is Vpp.

23. The a sense and decoding scheme of claim 20, including:

a plurality of sense node equalizers disposed between said first plurality of decoded transfer gates and said second plurality of decoded transfer gates, each sense node equalizer including a pair of shorting terminals coupled a pair of sense nodes, each sense node precharger providing a low impedance path between its shorting terminals in response to an equalization signal.

24. The a sense and decoding scheme of claim 20, including:

a plurality of first bit line equalizers disposed between the first array and said first plurality decoded transfer gates, each first bit line equalizer including a pair of shorting terminals coupled to a bit line pair of the first array, each first bit line equalizer providing a low impedance path between its shorting terminals in response to a first equalization signal; and a plurality of second bit line equalizers disposed between the second array and said second plurality decoded transfer gates, each second bit line equalizer including a pair of shorting terminals coupled to a bit line pair of the first array, each second bit line equalizer providing a low impedance path between its shorting terminals in response to a second equalization signal.

25. In a random access memory, an interconnect and control architecture, comprising:

a first memory cell array having a plurality of memory cells arranged in rows and columns;

a second memory cell array having a plurality of memory cells arranged in rows and columns;

a plurality of first bit lines disposed in a first direction, each bit line being commonly coupled to substantially all of the cells in at least one column of said first memory cell array, said first bit lines having a first pitch;

a plurality of second bit lines commonly coupled to substantially all of the cells in at least one column of said second memory cell array;

a first column sense and selector disposed between said first memory cell array and said second memory cell array and coupled to said first and second bit lines, said first column selector coupling data from selected of the first and second bit lines to a plurality of output nodes in response to a plurality of column decode signals;

a decoder for receiving a plurality of memory address signals and generating therefrom a plurality of column decoder signals; and a plurality of column select lines disposed in the first direction, over and insulated from at least said first bit lines, said plurality of column lines having a second pitch greater than the first pitch, said column select lines coupling the column decoder signals to said first column sense and selector.

26. The interconnect and control architecture of claim 25, including:

said first column sense and selector includes a plurality of sense amplifiers for receiving the data from the first and second bit lines and amplifying the data;

a sense circuit for generating a sense timing signal in response to an external signal; and at least one sense enable line, disposed in the first direction interspersed with said column select lines, over and insulated from said plurality of bit lines, for coupling the sense signal to said plurality of sense amplifiers.

27. The interconnect and control architecture of claim 25, including:

a first plurality of transfer gates for coupling the data from said first memory cell array to said first column sense and selector in response to a first transfer gate enable signal;

a second plurality of transfer gates for coupling the data from said second memory cell array to said first column sense and selector in response to a second transfer gate enable signal;

said decoder generates the first and second transfer gate enable signal in response to at least one memory address signal; and at least one transfer gate enable line, disposed in the first direction between column select lines, over and insulated from said plurality of bit lines, for coupling first and second transfer gate enable signal to said plurality of first and second transfer gates.

28. The interconnect and control architecture of claim 25, including:

a first power supply for providing a first potential; and at least one first power supply line, disposed in the first direction interspersed with said column select lines, over and insulated from said plurality of bit lines, for coupling the first potential to said column sense and selector.

29. The interconnect and control architecture of claim 25, including:

a third memory cell array having a plurality of memory cells arranged in rows and columns;

a fourth memory cell array having a plurality of memory cells arranged in rows and columns;

a plurality of third bit lines commonly coupled to substantially all of the cells in at least one column of said third memory cell array;

a plurality of fourth bit lines commonly coupled to substantially all of the cells in at least one column of said fourth memory cell array;

a second column sense and selector disposed between said third memory cell array and said fourth memory cell array and coupled to said third and fourth bit lines, said second column selector coupling data from selected multiple bit lines to a plurality of output nodes in response to the plurality of column decode signals; and said plurality of column select lines are disposed over and insulated from at least said third bit lines, said column select lines coupling the column decoder signals to said second column sense and selector.

30. The interconnect and control architecture of claim 29, including:

said decoder includes a column decoder and column predecoder, the column decoder being disposed between said first memory cell array and said third memory cell array and generating the column decoder signals in response to a plurality of column predecoder signals, the column predecoder generating a plurality of column predecoder signals in response to the plurality of memory address signals;

a plurality of column predecoder lines disposed in the first direction, over and insulated from at least said third bit lines, said plurality of column predecoder lines coupling the column predecoder signals from the column predecoder to the column decoder.

31. The interconnect and control architecture of claim 25, including:

a plurality of power bus lines disposed in the first direction, over and insulated from at least said first bit lines, said power bus lines coupling at least a first power supply to the random access memory.

* * * * *